United States Patent
Lin et al.

(10) Patent No.: US 10,325,990 B2
(45) Date of Patent: Jun. 18, 2019

(54) HIGH ELECTRON MOBILITY TRANSISTOR DEVICES AND METHOD FOR FABRICATING THE SAME

(71) Applicant: Vanguard International Semiconductor Corporation, Hsinchu (TW)

(72) Inventors: Hsin-Chih Lin, Hsinchu (TW); Shin-Cheng Lin, Tainan (TW); Yung-Hao Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/723,866

(22) Filed: Oct. 3, 2017

(65) Prior Publication Data

US 2019/0103468 A1   Apr. 4, 2019

(51) Int. Cl.
| | |
|---|---|
| *H01L 29/417* | (2006.01) |
| *H01L 29/66* | (2006.01) |
| *H01L 29/778* | (2006.01) |
| *H01L 29/207* | (2006.01) |
| *H01L 29/20* | (2006.01) |
| *H01L 29/205* | (2006.01) |
| *H01L 21/285* | (2006.01) |

(52) U.S. Cl.
CPC .. *H01L 29/41766* (2013.01); *H01L 21/28575* (2013.01); *H01L 29/2003* (2013.01); *H01L 29/205* (2013.01); *H01L 29/207* (2013.01); *H01L 29/66462* (2013.01); *H01L 29/778* (2013.01)

(58) Field of Classification Search
None
See application file for complete search history.

(56) References Cited

U.S. PATENT DOCUMENTS

| | | | |
|---|---|---|---|
| 2014/0264379 A1* | 9/2014 | Kub | H01L 29/41725 257/77 |
| 2016/0043219 A1* | 2/2016 | Liu | H01L 29/7827 257/329 |
| 2016/0240679 A1* | 8/2016 | Chen | H01L 29/7849 |
| 2017/0194473 A1* | 7/2017 | Sonsky | H01L 29/872 |
| 2017/0352755 A1* | 12/2017 | Nishimori | H01L 29/1075 |

FOREIGN PATENT DOCUMENTS

| | | |
|---|---|---|
| TW | 201431076 A | 8/2014 |
| TW | 201546911 A | 12/2015 |
| TW | 201707065 A | 2/2017 |

* cited by examiner

*Primary Examiner* — Mounir S Amer
(74) *Attorney, Agent, or Firm* — Birch, Stewart, Kolasch & Birch, LLP

(57) ABSTRACT

A HEMT device is provided. The HEMT device includes a substrate, a buffer layer, a first epitaxial layer, a second epitaxial layer, an insulating layer, a gate, a source, a drain, a trench, and a metal layer. The buffer layer is formed on the substrate. The first epitaxial layer is formed on the buffer layer. The second epitaxial layer is formed on the first epitaxial layer. The insulating layer is formed on the second epitaxial layer. The gate is disposed in the insulating layer. The source and the drain are disposed in the insulating layer. The trench passes through the insulating layer and the second epitaxial layer, and extends into the first epitaxial layer. The metal layer is formed on the insulating layer to connect to the source, and is filled into the trench to electrically connect to the first epitaxial layer and the source.

10 Claims, 6 Drawing Sheets

HIGH ELECTRON MOBILITY TRANSISTOR DEVICES AND METHOD FOR FABRICATING THE SAME

TECHNICAL FIELD

The technical field relates to a HEMT device which is capable of effectively removing negative charges at the bottom of the device.

BACKGROUND

When a high electron mobility transistor (HEMT) device is actuated, due to certain characteristics of epitaxial material, such as the formation of an incomplete crystalline phase, a large number of impurities with negative charges can exist in an epitaxial layer which is located at the bottom of the device structure. At this time, if a high voltage is applied, these negative charges will be attracted to, and therefore move toward, the upper components of the device, affecting the actuation of the upper components. Similarly, it is also the material character of the epitaxial layer which provides a leakage path extending towards the substrate for the negative charges. However, no matter whether the negative charges in the device structure migrate towards the upper components, or whether they leak from the path extending towards the substrate, the actuation and safety of the components will be seriously impacted.

Therefore, development of a HEMT device which is capable of effectively removing negative charges at the bottom of the device is desirable.

SUMMARY

In accordance with one embodiment of the disclosure, a high electron mobility transistor (HEMT) device is provided. The HEMT device comprises a substrate, a buffer layer, a first epitaxial layer, a second epitaxial layer, an insulating layer, a gate, a source, a drain, a trench, and a metal layer. The buffer layer is formed on the substrate. The first epitaxial layer is formed on the buffer layer. The second epitaxial layer is formed on the first epitaxial layer. The insulating layer is formed on the second epitaxial layer. The gate is disposed in the insulating layer. The source and the drain are disposed in the insulating layer. The source and the drain are located on both sides of the gate. The trench passes through the insulating layer and the second epitaxial layer, and further extends into the first epitaxial layer. The metal layer is formed on the insulating layer to connect to the source, and further filled into the trench to electrically connect to the first epitaxial layer and the source.

In accordance with some embodiments, the substrate is a silicon substrate or a sapphire substrate.

In accordance with some embodiments, the buffer layer is a carbon-doped gallium nitride layer.

In accordance with some embodiments, the first epitaxial layer is a gallium nitride layer.

In accordance with some embodiments, the second epitaxial layer is a gallium aluminum nitride layer.

In accordance with some embodiments, the insulating layer is a silicon oxide layer, a silicon nitride layer, or a silicon oxynitride layer.

In accordance with some embodiments, the trench passes through the insulating layer, the second epitaxial layer, and the first epitaxial layer, and further extends into the buffer layer such that the metal layer is electrically connected to the buffer layer, the first epitaxial layer, and the source.

In this embodiment, the trench has a depth of 0.5-20 μm.

In accordance with some embodiments, the trench passes through the insulating layer, the second epitaxial layer, the first epitaxial layer, and the buffer layer, and further extends into the substrate such that the metal layer is electrically connected to the substrate, the buffer layer, the first epitaxial layer, and the source.

In this embodiment, the trench has a depth of 0.5-20 μm.

In accordance with one embodiment of the disclosure, a method for fabricating a high electron mobility transistor (HEMT) device is provided. The method comprises the following steps. A substrate is provided. A buffer layer is formed on the substrate. A first epitaxial layer is formed on the buffer layer. A second epitaxial layer is formed on the first epitaxial layer. An insulating layer is formed on the second epitaxial layer. A gate is disposed in the insulating layer. The source and the drain are disposed in the insulating layer. The source and the drain are located on both sides of the gate. A trench is formed to pass through the insulating layer and the second epitaxial layer, and further to extend into the first epitaxial layer. A metal layer is formed on the insulating layer to connect to the source, and further to fill into the trench to electrically connect to the first epitaxial layer and the source.

In accordance with some embodiments, the trench is etched to pass through the insulating layer, the second epitaxial layer, and the first epitaxial layer, and further to extend into the buffer layer such that the metal layer is electrically connected to the buffer layer, the first epitaxial layer, and the source.

In accordance with some embodiments, the trench is etched to pass through the insulating layer, the second epitaxial layer, the first epitaxial layer, and the buffer layer, and further to extend into the substrate such that the metal layer is electrically connected to the substrate, the buffer layer, the first epitaxial layer, and the source.

In the disclosure, the specific electrode path (i.e. the electrical connection path among the layers containing negative charges and the source with zero potential) is disposed to avoid the possibility of the migration of the negative charges, located at the bottom of the device structure, towards the upper components which impacts on the actuation of the upper components. Due to its material characteristics, the epitaxial material also provides a leakage path for negative charges that extends towards the substrate. Similarly, because of the disposition of the specific electrode path of the present disclosure, the negative charges in the device structure will no longer leak via this leakage path, thereby eliminating the possibility of a burnout in the event the component endures excessive power while in the off-state.

In the disclosure, a non-conductor such as sapphire (which is often adopted for epitaxy) may be utilized as a substrate material to carry out the epitaxial process. Since the sapphire substrate is non-conductive, it is therefore incapable of leading out the negative charges contained in the device structure by such a manner as that a backside of a silicon substrate is grounded. Therefore, in the disclosure, the specific electrode path (i.e. the electrical connection path among the layers containing the negative charges and the source with zero potential) is disposed to lead out the negative charges from the upper portion of the device structure. This overcomes the original material restriction of the sapphire substrate that is incapable of leading out negative charges through the grounding path.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
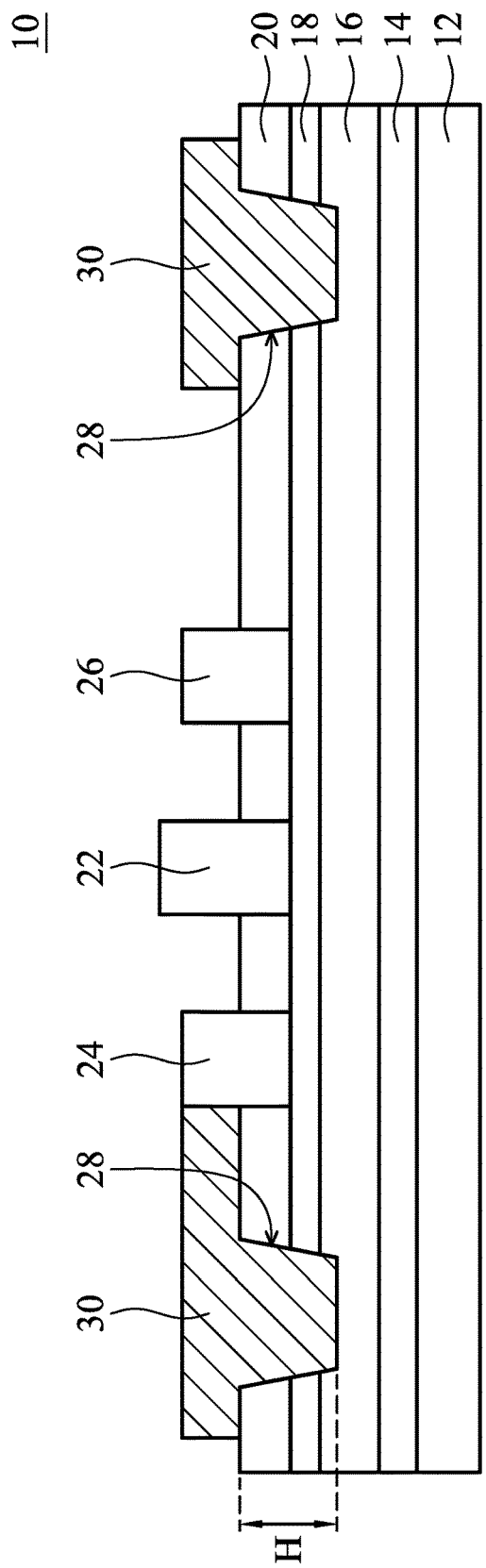
FIG. 1 is a cross-sectional view of a HEMT device in accordance with one embodiment of the disclosure.

Referring to FIG. 1, in accordance with one embodiment of the disclosure, a high electron mobility transistor (HEMT) device 10 is provided. FIG. 1 is a cross-sectional view of the HEMT device 10.

As shown in FIG. 1, in this embodiment, the high electron mobility transistor (HEMT) device 10 comprises a substrate 12, a buffer layer 14, a first epitaxial layer 16, a second epitaxial layer 18, an insulating layer 20, a gate 22, a source 24, a drain 26, a trench 28, and a metal layer 30.

As shown in FIG. 1, the buffer layer 14 is formed on the substrate 12. The first epitaxial layer 16 is formed on the buffer layer 14. The second epitaxial layer 18 is formed on the first epitaxial layer 16. The insulating layer 20 is formed on the second epitaxial layer 18. A part of the gate 22 is disposed in the insulating layer 20. A part of the source 24 and the drain 26 are disposed in the insulating layer 20. The source 24 and the drain 26 are located on both sides of the gate 22. Specifically, in this embodiment, the trench 28 passes through the insulating layer 20 and the second epitaxial layer 18, and further extends into the first epitaxial layer 16, as shown in FIG. 1. In addition, the metal layer 30 is formed on the insulating layer 20 to connect to the source 24, and further filled into the trench 28 to electrically connect to the first epitaxial layer 16 and the source 24.

In some embodiments, the substrate 12 may be a silicon substrate or a sapphire substrate.

In some embodiments, the buffer layer 14 may be a carbon-doped gallium nitride layer.

In some embodiments, the first epitaxial layer 16 may be a gallium nitride (GaN) layer.

In some embodiments, the second epitaxial layer 18 may be a gallium aluminum nitride (GaAlN) layer.

In some embodiments, the insulating layer 20 may be a silicon oxide layer, a silicon nitride layer, or a silicon oxynitride layer.

In this embodiment, the trench 28 has a depth H ranging from about 0.5 μm to about 20 μm.

Figure 2:
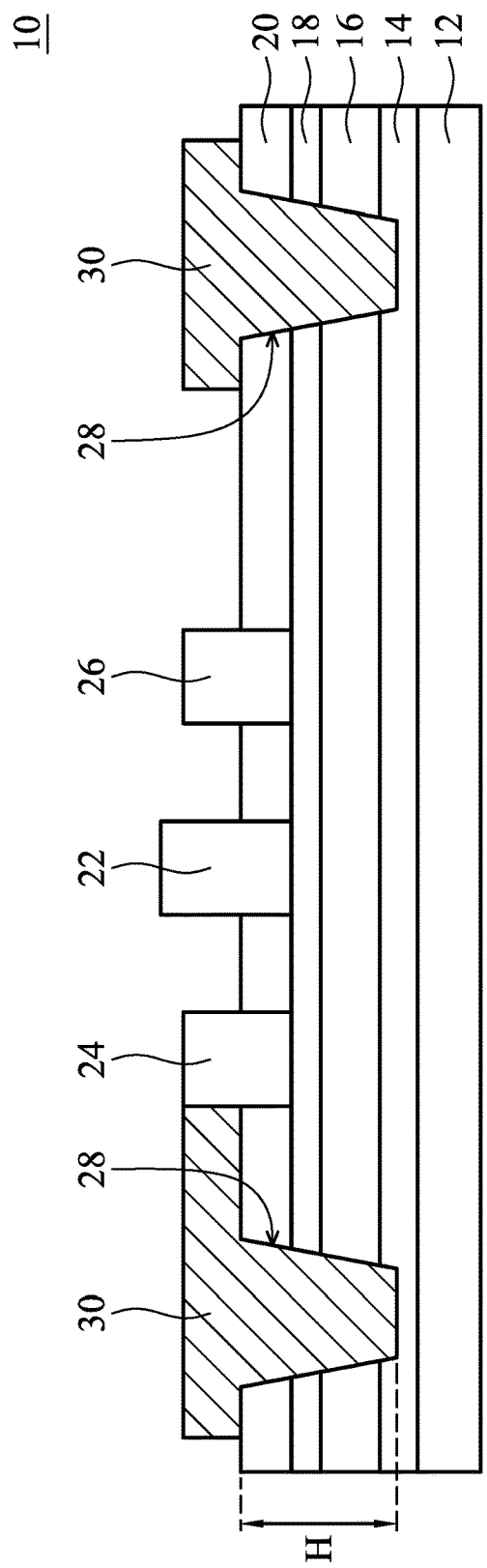
FIG. 2 is a cross-sectional view of a HEMT device in accordance with one embodiment of the disclosure.

Referring to FIG. 2, in accordance with one embodiment of the disclosure, a high electron mobility transistor (HEMT) device 10 is provided. FIG. 2 is a cross-sectional view of the HEMT device 10.

As shown in FIG. 2, in this embodiment, the high electron mobility transistor (HEMT) device 10 comprises a substrate 12, a buffer layer 14, a first epitaxial layer 16, a second epitaxial layer 18, an insulating layer 20, a gate 22, a source 24, a drain 26, a trench 28, and a metal layer 30.

As shown in FIG. 2, the buffer layer 14 is formed on the substrate 12. The first epitaxial layer 16 is formed on the buffer layer 14. The second epitaxial layer 18 is formed on the first epitaxial layer 16. The insulating layer 20 is formed on the second epitaxial layer 18. A part of the gate 22 is disposed in the insulating layer 20. A part of the source 24 and the drain 26 are disposed in the insulating layer 20. The source 24 and the drain 26 are located on both sides of the gate 22. Specifically, in this embodiment, the trench 28 passes through the insulating layer 20, the second epitaxial layer 18, and the first epitaxial layer 16, and further extends into the buffer layer 14, as shown in FIG. 2. In addition, the metal layer 30 is formed on the insulating layer 20 to connect to the source 24, and further filled into the trench 28 to electrically connect to the buffer layer 14, the first epitaxial layer 16, and the source 24.

In some embodiments, the substrate 12 may be a silicon substrate or a sapphire substrate.

In some embodiments, the buffer layer 14 may be a carbon-doped gallium nitride layer.

In some embodiments, the first epitaxial layer 16 may be a gallium nitride (GaN) layer.

In some embodiments, the second epitaxial layer 18 may be a gallium aluminum nitride (GaAlN) layer.

In some embodiments, the insulating layer 20 may be a silicon oxide layer, a silicon nitride layer, or a silicon oxynitride layer.

In this embodiment, the trench 28 has a depth H ranging from about 0.5 μm to about 20 μm.

Figure 3:
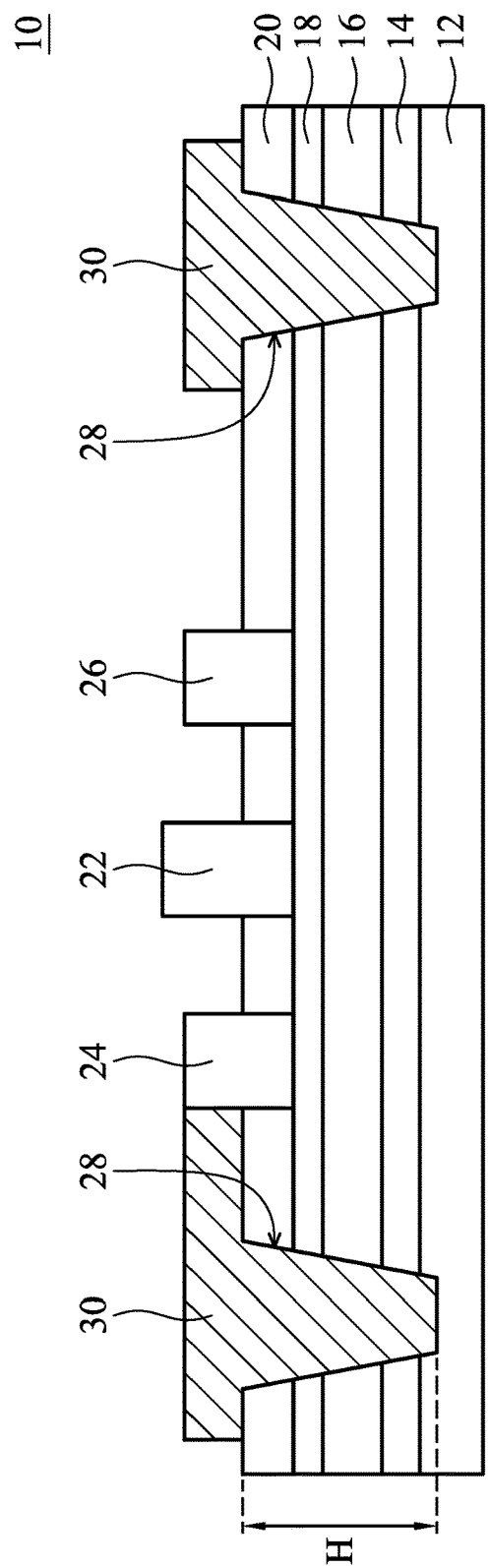
FIG. 3 is a cross-sectional view of a HEMT device in accordance with one embodiment of the disclosure.

Referring to FIG. 3, in accordance with one embodiment of the disclosure, a high electron mobility transistor (HEMT) device 10 is provided. FIG. 3 is a cross-sectional view of the HEMT device 10.

As shown in FIG. 3, in this embodiment, the high electron mobility transistor (HEMT) device 10 comprises a substrate 12, a buffer layer 14, a first epitaxial layer 16, a second epitaxial layer 18, an insulating layer 20, a gate 22, a source 24, a drain 26, a trench 28, and a metal layer 30.

As shown in FIG. 3, the buffer layer 14 is formed on the substrate 12. The first epitaxial layer 16 is formed on the buffer layer 14. The second epitaxial layer 18 is formed on the first epitaxial layer 16. The insulating layer 20 is formed on the second epitaxial layer 18. A part of the gate 22 is disposed in the insulating layer 20. A part of the source 24 and the drain 26 are disposed in the insulating layer 20. The source 24 and the drain 26 are located on both sides of the gate 22. Specifically, in this embodiment, the trench 28 passes through the insulating layer 20, the second epitaxial layer 18, the first epitaxial layer 16, and the buffer layer 14, and further extends into the substrate 12, as shown in FIG. 3. In addition, the metal layer 30 is formed on the insulating layer 20 to connect to the source 24, and further filled into the trench 28 to electrically connect to the substrate 12, the buffer layer 14, the first epitaxial layer 16, and the source 24.

In some embodiments, the substrate 12 may be a silicon substrate or a sapphire substrate.

In some embodiments, the buffer layer 14 may be a carbon-doped gallium nitride layer.

In some embodiments, the first epitaxial layer 16 may be a gallium nitride (GaN) layer.

In some embodiments, the second epitaxial layer 18 may be a gallium aluminum nitride (GaAlN) layer.

In some embodiments, the insulating layer 20 may be a silicon oxide layer, a silicon nitride layer, or a silicon oxynitride layer.

In this embodiment, the trench 28 has a depth H ranging from about 0.5 μm to about 20 μm.

Figure 4A:
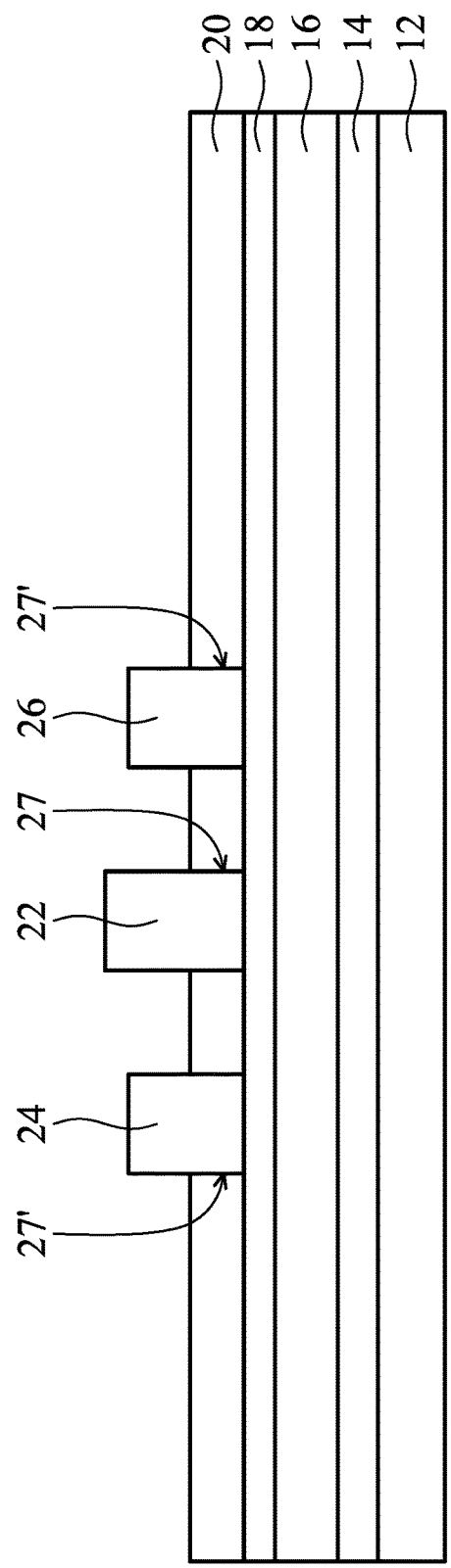
FIGS. 4A-4B are cross-sectional views of a method for fabricating a HEMT device in accordance with one embodiment of the disclosure.
Figure 4B:
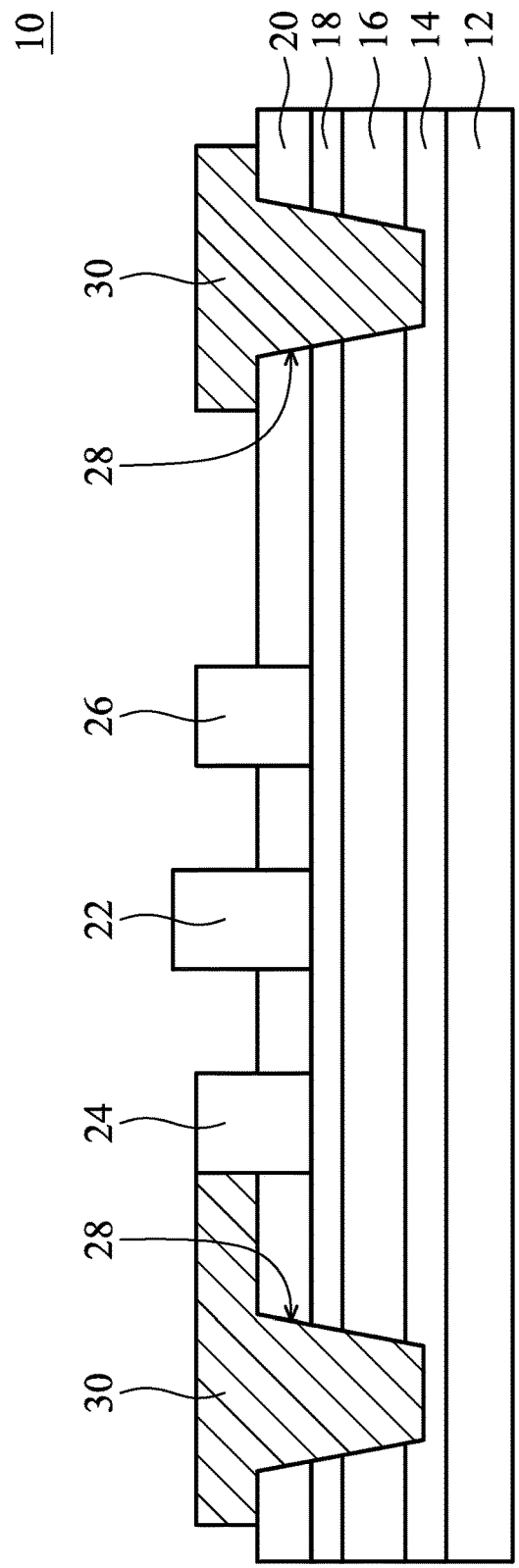

Referring to FIGS. 4A-4B, in accordance with one embodiment of the disclosure, a method for fabricating a high electron mobility transistor (HEMT) device 10 is provided. FIGS. 4A-4B are cross-sectional views of the method for fabricating the HEMT device 10.

As shown in FIG. 4A, a substrate 12 is provided. A buffer layer 14, a first epitaxial layer 16, a second epitaxial layer 18, and an insulating layer 20 are formed on the substrate 12 in order.

In some embodiments, the substrate 12 may be a silicon substrate or a sapphire substrate.

In some embodiments, the buffer layer 14 may be a carbon-doped gallium nitride layer.

In some embodiments, the first epitaxial layer 16 may be a gallium nitride (GaN) layer.

In some embodiments, the second epitaxial layer 18 may be a gallium aluminum nitride (GaAlN) layer.

In some embodiments, the insulating layer 20 may be a silicon oxide layer, a silicon nitride layer, or a silicon oxynitride layer.

Next, a patterned photoresist layer (not shown) is formed on the insulating layer 20. The locations of a gate, a source, and a drain in which are subsequently to be disposed are exposed.

Next, an etching process is performed on the insulating layer 20 to form a first opening 27 and a plurality of second openings 27'. The second openings 27' are located on both sides of the first opening 27.

Next, a gate 22 is formed in the first opening 27. A source 24 and a drain 26 are formed in the second openings 27'. The patterned photoresist layer is then removed.

Next, as shown in FIG. 4B, a trench 28 is formed to pass through the insulating layer 20, the second epitaxial layer 18, and the first epitaxial layer 16, and further extend into the buffer layer 14.

Next, a metal layer 30 is formed on the insulating layer 20 to connect to the source 24, and further filled into the trench 28 to electrically connect to the buffer layer 14, the first epitaxial layer 16, and the source 24.

In this embodiment, the trench 28 has a depth H ranging from about 0.5 μm to about 20 μm.

In some embodiments, the depth H of the trench 28 may also be adjusted to meet the demands of the manufacturing process. For example, the trench 28 may be formed to pass through the insulating layer 20 and the second epitaxial layer 18, and extend into the first epitaxial layer 16 such that the subsequently filled metal layer 30 forms an electrical connection between the first epitaxial layer 16 and the source 24. The aforementioned structure profile is shown in FIG. 1.

In this embodiment, the trench 28 has a depth H ranging from about 0.5 μm to about 20 μm.

In some embodiments, the trench 28 may also be formed to pass through the insulating layer 20, the second epitaxial layer 18, the first epitaxial layer 16, and the buffer layer 14, and further extend into the substrate 12 such that the subsequently filled metal layer 30 forms an electrical connection among the substrate 12, the buffer layer 14, the first epitaxial layer 16, and the source 24. The aforementioned structure profile is shown in FIG. 3.

In this embodiment, the trench 28 has a depth H ranging from about 0.5 μm to about 20 μm.

Therefore, the fabrication of the HEMT device 10 of this embodiment is completed.

Figure 4C:
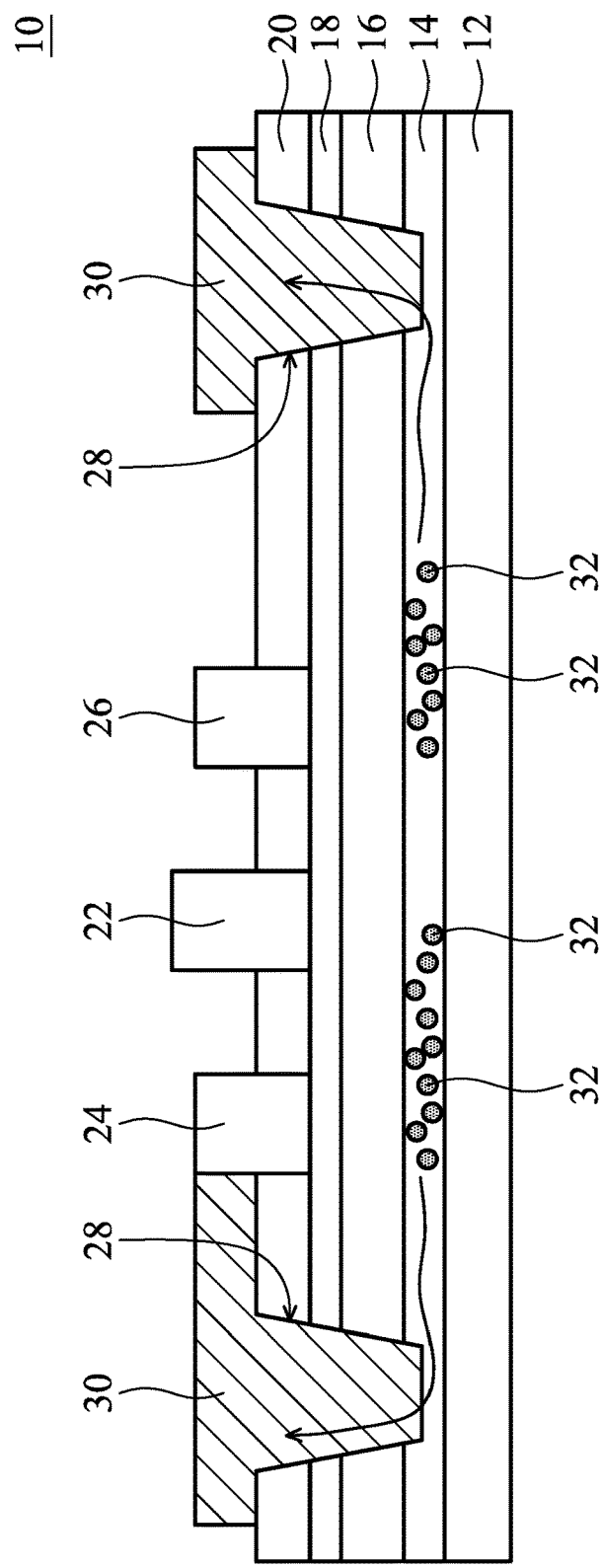
FIG. 4C is a schematic diagram of a HEMT device in operation in accordance with one embodiment of the disclosure.

Referring to FIG. 4C, in accordance with one embodiment of the disclosure, the manner in which the high electron mobility transistor (HEMT) device 10 excludes negative charges located at the bottom of the HEMT device 10 is illustrated further. FIG. 4C is a schematic diagram of the HEMT device 10 in operation.

Due to certain characteristics of the epitaxial material, such as formation of an incomplete crystalline phase, a large number of impurities with negative charges 32 exist in the epitaxial layer (e.g., the carbon-doped gallium nitride buffer layer 14) which is located at the bottom of the device structure when the HEMT device 10 is actuated. At this time, if a high voltage is applied, these negative charges 32 will be attracted to, and move toward, the upper components (e.g., the channel, the gate oxide layer, etc.), affecting the actuation of the upper components. Therefore, in order to smoothly remove the negative charges located at the bottom of the device structure, as shown in FIG. 4C, in the present disclosure, the electrode 30 is fabricated, which passes through a part of the device structure (e.g., the insulating layer 20, the second epitaxial layer 18, and the first epitaxial layer 16) and extends into a layer containing the negative charges 32 (e.g., the carbon-doped gallium nitride buffer layer 14), and the electrode 30 is connected to the source 24. This path is established for forming an electrical connection between the layer containing the negative charges 32 (for example, the carbon-doped gallium nitride buffer layer 14) and the source 24. Thus, when a high voltage is applied, the negative charges 32 located at the bottom of the device structure are smoothly removed through the new path established by the present disclosure. That is, for example, the negative charges 32 in the buffer layer 14 are removed along the path of the electrode 30, without affecting the actuation of the upper components (e.g., the channel, the gate oxide layer, etc.). If the other layers (e.g., the first epitaxial layer 16) that are electrically connected to the electrode 30 contain negative charges, these negative charges may also be simultaneously removed via this path.

In the disclosure, the specific electrode path (i.e. the electrical connection path among the layers containing negative charges and the source with zero potential) is disposed to avoid the possibility of the migration of the negative charges, located at the bottom of the device structure, towards the upper components which impacts on the actuation of the upper components. Due to its material characteristics, the epitaxial material also provides a leakage path for negative charges that extends towards the substrate. Similarly, because of the disposition of the specific electrode path of the present disclosure, the negative charges in the device structure will no longer leak via this leakage path, eliminating the possibility of burnout in the event the component endures excessive power while in the off-state.

In the disclosure, a non-conductor such as sapphire (which is often adopted for epitaxy) is utilized as a substrate material to carry out the epitaxial process. The sapphire substrate is non-conductive, so therefore it is incapable of leading out the negative charges contained in the device structure by such a manner as that a backside of a silicon substrate is grounded. Therefore, in the disclosure, the specific electrode path (i.e. the electrical connection path among the layers containing the negative charges and the source with zero potential) is disposed to lead out the negative charges from the upper portion of the device structure which overcomes the original material restriction of the sapphire substrate that is incapable of leading out negative charges through the grounding path.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high electron mobility transistor (HEMT) device, comprising:
   a substrate;
   a buffer layer formed on the substrate;
   a first epitaxial layer formed on the buffer layer;
   a second epitaxial layer formed on the first epitaxial layer;
   an insulating layer formed on the second epitaxial layer;
   a gate disposed in the insulating layer;
   a source and a drain disposed in the insulating layer, wherein the source and the drain are located on both sides of the gate;
   a trench passing through the insulating layer and the second epitaxial layer, and extending into the first epitaxial layer; and
   a metal layer formed on the insulating layer to connect to the source, and filled into the trench to electrically connect to the first epitaxial layer and the source, wherein an orthogonal projection of the metal layer onto the substrate does not overlap an orthogonal projection of the source onto the substrate.

2. The high electron mobility transistor (HEMT) device as claimed in claim 1, wherein the substrate is a silicon substrate or a sapphire substrate.

3. The high electron mobility transistor (HEMT) device as claimed in claim 1, wherein the buffer layer is a carbon-doped gallium nitride layer.

4. The high electron mobility transistor (HEMT) device as claimed in claim 1, wherein the first epitaxial layer is a gallium nitride layer.

5. The high electron mobility transistor (HEMT) device as claimed in claim 1, wherein the second epitaxial layer is a gallium aluminum nitride layer.

6. The high electron mobility transistor (HEMT) device as claimed in claim 1, wherein the insulating layer is a silicon oxide layer, a silicon nitride layer, or a silicon oxynitride layer.

7. The high electron mobility transistor (HEMT) device as claimed in claim 1, wherein the trench passes through the insulating layer, the second epitaxial layer, and the first epitaxial layer, and extends into the buffer layer such that the metal layer is electrically connected to the buffer layer, the first epitaxial layer, and the source.

8. The high electron mobility transistor (HEMT) device as claimed in claim 1, wherein the trench passes through the insulating layer, the second epitaxial layer, the first epitaxial layer, and the buffer layer, and extends into the substrate such that the metal layer is electrically connected to the substrate, the buffer layer, the first epitaxial layer, and the source.

9. The high electron mobility transistor (HEMT) device as claimed in claim 7, wherein the trench has a depth of 0.5-20 μm.

10. The high electron mobility transistor (HEMI) device as claimed in claim 8, wherein the trench has a depth of 0.5-20 μm.

* * * * *